(12) United States Patent
Shiobara et al.

(10) Patent No.: US 7,794,856 B2
(45) Date of Patent: Sep. 14, 2010

(54) ORGANIC LIGHT-EMITTING DEVICE AND DISPLAY APPARATUS

(75) Inventors: Satoru Shiobara, Tokyo (JP); Koichi Suzuki, Yokohama (JP); Kazunori Ueno, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 672 days.

(21) Appl. No.: 11/759,527

(22) Filed: Jun. 7, 2007

(65) Prior Publication Data

US 2007/0292716 A1    Dec. 20, 2007

(30) Foreign Application Priority Data

Jun. 15, 2006    (JP) .............................. 2006-166621

(51) Int. Cl.
*H01L 51/54* (2006.01)

(52) U.S. Cl. ...................... 428/690; 428/917; 313/504; 313/506

(58) Field of Classification Search ....................... None
See application file for complete search history.

(56) References Cited

U.S. PATENT DOCUMENTS

| | | | | |
|---|---|---|---|---|
| 5,420,288 | A | * | 5/1995 | Ohta et al. .................. 548/145 |
| 6,916,555 | B2 | | 7/2005 | Suzuki et al. ............... 428/690 |
| 7,229,702 | B2 | | 6/2007 | Saitoh et al. ................ 428/690 |
| 2001/0024083 | A1 | * | 9/2001 | Yamazaki et al. ........... 313/483 |
| 2002/0028347 | A1 | * | 3/2002 | Marrocco et al. ........... 428/690 |
| 2002/0145380 | A1 | * | 10/2002 | Aziz et al. ................... 313/504 |
| 2004/0150333 | A1 | * | 8/2004 | Tsutsui ........................ 313/512 |
| 2007/0138947 | A1 | * | 6/2007 | Popovic et al. .............. 313/504 |

FOREIGN PATENT DOCUMENTS

JP    2003-231692    8/2003

OTHER PUBLICATIONS

Lee et al., Applied Physics Letters, vol. 79, No. 3, Jul. 16, 2001, pp. 308-310.*
Nakano et al., "Synthesis, Structure, and Photophysical and Electrochemical Properties of a π-Stacked Polymer," *J. Am. Chem. Soc.*, vol. 125, 15474-15484 (2003).
Takimiya et al., "Synthesis, Structures, and Properties of Two Isomeric Naphthodithiophenes and Their Methyl, Methylthio, and 2-Thienyl Derivatives; Application to Conductive Charge-Transfer Complexes and Low-Bandgap Polymers," *Bull. Chem. Soc. Jpn.*, vol. 75, 1795-1805 (2002).

(Continued)

*Primary Examiner*—Dawn Garrett
(74) *Attorney, Agent, or Firm*—Fitzpatrick, Cella, Harper & Scinto

(57) ABSTRACT

Provided is an organic light-emitting device which has an optical output with high emission efficiency and high luminance and which includes a pair of electrodes, and at least one layer including an organic compound and interposed between the electrodes, wherein the at least one layer including the organic compound includes an oligofluorene compound represented by the following general formula. At least a light-emitting layer of the at least one layer including the organic compound includes the oligofluorene compound and a light-emitting compound selected from a fluorescent compound and a phosphorescent compound. A weight ratio (B/A) of the light-emitting compound (B) selected from the fluorescent compound and the phosphorescent compound to the oligofluorene compound (A) is 1/100 or more and 100/100 or less.

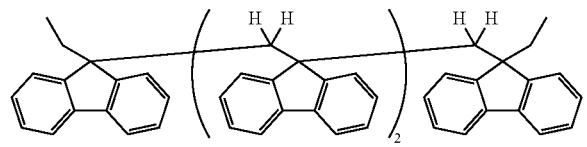

7 Claims, 4 Drawing Sheets

OTHER PUBLICATIONS

Wiklund et al., "Stereochemistry of 3,3'-Bithienyls," *Chemica Scripta.*, vol. 3, 220-225 (1973).

Miyaura et al., "Palladium-Catalyzed Cross-Coupling Reactions of Organoboron Compounds," *Chemical Reviews*, vol. 95, No. 7, 2447-2488 (1995).

Yamamoto et al., "A Novel Type of Polycondensation Utilizing Transition Metal-Catalyzed C-C Coupling. I. Preparation of Thermostable Polyphenylene Type Polymers," *Bull. Chem. Soc. Jpn.*, vol. 51, No. 7, 2091-2097 (1978).

Ghosal et al., "Formation of 1,3-Diynes, 1,3-Dienes, and Biphenyls via the Copper(II) Nitrate Mediated Coupling of Organotin Compounds," *J. Org. Chem.*, vol. 52, 4296-4298 (1987).

Kang et al., "Existence of Intramolecular Triplet Excimer of Bis(9-fluorenyl)methane: Phosphorescence and Delayed Fluorescence Spectroscopic and ab Initio Studies," *J. Phys. Chem. A*, vol. 109, 6799-6804 (2005).

\* cited by examiner

ORGANIC LIGHT-EMITTING DEVICE AND DISPLAY APPARATUS

BACKGROUND OF THE INVENTION

1. Field of the Invention

The present invention relates to an organic light-emitting device and a display apparatus including the organic light-emitting device.

2. Description of the Related Art

An application example of an organic light-emitting device is an organic EL display. The realization of an organic EL display having excellent performance such as low power consumption, high luminance, and a long life requires further improvement in performance of a material for the display. Moreover, in order to realize a low-cost organic EL display, production of an organic EL display by a coating process using, for example, a high molecular weight (or polymeric) material is now mainstream.

One of the problems encountered when using the high molecular weight material is that a high molecular weight organic light-emitting device has a shorter operating life than that of a low molecular weight organic light-emitting device. In general, a high molecular weight material is synthesized by polymerizing at least one kind of monomers. However, the resulting high molecular weight material has a molecular weight distribution and is extremely difficult to be purified, which is a main factor that adversely affects the device operating life.

In addition, there is also the problem that the flatness and electronic characteristics of a thin film formed of a high molecular weight material largely vary depending on the forming method or processing conditions thereof.

To overcome the above-mentioned problems of the high molecular weight material, attempts have been made to improve the device operating life by using a dendrimer having an intermediate molecular weight (Japanese Patent Application Laid-Open No. 2003-231692).

The conduction of a thin film formed of organic molecules is described by the hopping conduction of charges or electrons. In general, in the organic compound, there is a tendency that those having high planarity of molecular structure and large overlap of Π electrons provide high mobility, even in the form of an amorphous film. The tendency can also be presumed by the fact that pentacene, porphyrin, or the like shows high mobility in an organic thin-film transistor (organic TFT).

In this regard, Π-Π stacking fluorene compounds have been reported as compounds having an intermediate molecular weight ("J. Am. Chem. Soc.", 125, 15474 (2003)). In those compounds, the emission of light from fluorene excimers by photoexcitation has been observed. In general, it is meant that a molecule causing such excimer emission has a large interaction between chromophores in the same molecule, that is, has a large overlap between the orbitals of the chromophores. Therefore, such Π-Π stacking molecules are expected to have high mobility of charges or electrons upon hopping conduction of the charges or electrons owing to the effect of large overlap between orbitals of molecules.

SUMMARY OF THE INVENTION

In view of the foregoing technical problems, the present invention provides an organic light-emitting device using a novel organic light-emitting material and having an optical output with high emission efficiency and high luminance.

The present invention also provides a display apparatus including the organic light-emitting device.

That is, the present invention provides an organic light-emitting device including a pair of electrodes and at least one layer including an organic compound and interposed between the electrodes, in which the layer including the organic compound includes an oligofluorene compound represented by the following general formula [1]:

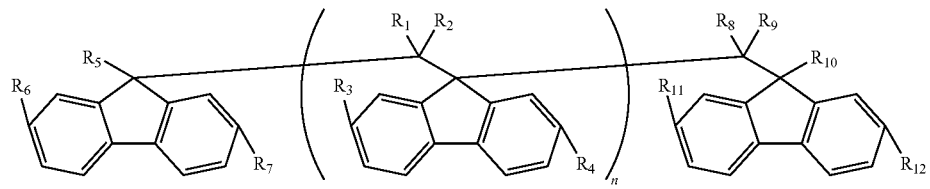

wherein $R_1$, $R_2$, $R_3$, $R_4$, $R_5$, $R_6$, $R_7$, $R_8$, $R_9$, $R_{10}$, $R_{11}$, and $R_{12}$ each represent, independently of one another, a hydrogen atom, a halogen atom, a substituted or unsubstituted alkyl group, a substituted or unsubstituted aralkyl group, a substituted or unsubstituted cycloalkyl group, a substituted or unsubstituted alkenyl group, a substituted or unsubstituted cycloalkenyl group, a substituted or unsubstituted alkoxy group, a substituted or unsubstituted aryl group, a substituted or unsubstituted fused polycyclic aromatic group, a substituted or unsubstituted heterocyclic group, a substituted or unsubstituted amino group, a substituted or unsubstituted ester group, a substituted or unsubstituted carbonyl group, or a substituted or unsubstituted carbamoyl group; and n represents an integer of 1 to 20.

In the general formula [1], n preferably represents an integer of 1 to 10 because the compounds with such n values have high solubility to a solvent, and can be easily synthesized.

It is preferable that at least a light-emitting layer of the at least one layer including an organic compound includes the oligofluorene compound and a light-emitting compound selected from a fluorescent compound and a phosphorescent compound.

It is preferable that the weight ratio (B/A) of the light-emitting compound (B) selected from a fluorescent compound and a phosphorescent compound to the oligofluorene compound (A) be 1/100 or more and 100/100 or less. It is preferable that at least a hole-transporting layer of the at least one layer including an organic compound include the oligofluorene compound and a hole-transporting compound.

It is preferable that the weight ratio (A/C) of the oligofluorene compound (A) to the hole transporting compound (C) be 1/100 or more and 100/100 or less.

Further, the present invention provides an organic light-emitting device including a pair of electrodes, and at least one layer including an organic compound interposed between the electrodes, in which the at least one layer including an organic compound includes at least one kind of an organic compound which shows excimer emission or exciplex emission and has a maximal peak thereof at 350 nm or more and 600 nm or less.

Still further, the present invention provides a display apparatus including the organic light-emitting device.

According to the present invention, there can be provided an organic light-emitting device using a novel organic light-emitting material and having an optical output with high emission efficiency and high luminance.

In addition, according to the present invention, there can be provided a display apparatus including the organic light-emitting device.

Further features of the present invention will become apparent from the following description of exemplary embodiments with reference to the attached drawings.

DESCRIPTION OF THE PREFERRED EMBODIMENTS

Figure 1:
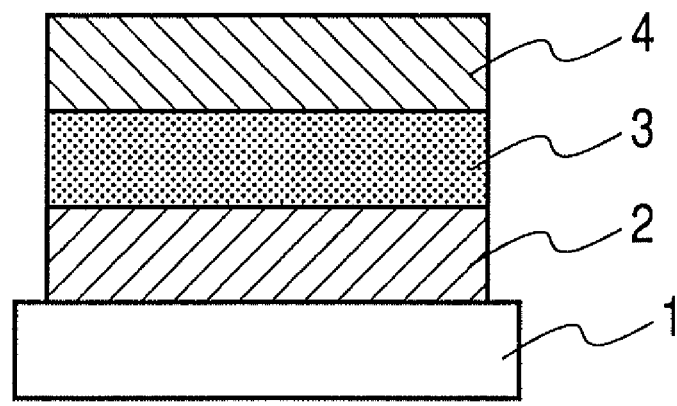
FIG. 1 is a cross-sectional view illustrating an example of an organic light-emitting device of the present invention.

Hereinafter, the present invention will be described in detail.

The organic light-emitting device of the present invention is an organic light-emitting device including a pair of electrodes; and at least one layer containing an organic compound interposed between the electrodes, in which the at least one layer containing an organic compound contains an oligofluorene compound represented by the following general formula [1].

General formula [1]

First, the oligofluorene compound to be used in the organic light-emitting device of the present invention will be described.

Specific examples of substituents $R_1$, $R_2$, $R_3$, $R_4$, $R_5$, $R_6$, $R_7$, $R_8$, $R_9$, $R_{10}$, $R_{11}$, and $R_{12}$ in the general formula [1] are shown below. $R_1$, $R_2$, $R_3$, $R_4$, $R_5$, $R_6$, $R_7$, $R_8$, $R_9$, $R_{10}$, $R_{11}$, and $R_{12}$ each independently represent a hydrogen atom, a halogen atom, or any one of the below-mentioned substituents.

As the substituted or unsubstituted alkyl group and the substituted or unsubstituted aralkyl group, there are included, for example, methyl group, trifluoromethyl group, ethyl group, n-propyl group, iso-propyl group, ter-butyl group, octyl group, 2-ethyl-octyl group, dodecane group, benzyl group, and phenethyl group.

As the substituted or unsubstituted cycloalkyl group, there are included, for example, cyclopentyl group, cyclohexyl group, cyclooctyl group, adamantanyl group, and methylcyclohexyl group.

As the substituted or unsubstituted alkenyl group, there are included, for example, vinyl group, allyl group (2-propenyl group), 1-propenyl group, iso-propenyl group, and 2-butenyl group.

As the substituted or unsubstituted cycloalkenyl group, there are included, for example, cyclopentenyl group, cyclohexenyl group, cyclohexedienyl group, and cyclooctenyl group.

As the substituted or unsubstituted alkoxyl group, there are included, for example, methoxy group, ethoxy group, propoxy group, 2-ethyloctyloxy group, phenoxy group, 4-butylphenoxy group, and benzyloxy group.

As the substituted or unsubstituted aryl group, there are included, for example, phenyl group, 4-methylphenyl group, 4-ethylphenyl group, tert-butylphenyl group, 4-octylphenyl group, 3-chlorophenyl group, 3,5-dimethylphenyl group, and triphenylamino group.

As the substituted or unsubstituted condensed polycyclic aromatic group, there are included, for example, biphenyl group, terphenyl group, naphthyl group, fluorenyl group; carbazoyl group, phenanthryl group, anthranyl group, pyrenyl group, pyridyl group, and bipyridyl group.

As the substituted or unsubstituted heterocyclic group, there are included, for example, pyridyl group, bipyridyl group, methylpyridyl group, thienyl group, terthienyl group, propylthienyl group, furyl group, quinolyl group, carbazolyl group, and N-ethylcarbazolyl group.

As the substituted or unsubstituted amino group, there are included, for example, methylamino group, ethylamino group, dimethylamino group, diethylamino group, methylethylamino group, benzylamino group, methylbenzylamino group, anilino group, diphenylamino group; phenyltolylamino group, and ditolylamino group.

As the substituted or unsubstituted carbonyl group, there are included, for example, acetyl group, propionyl group,

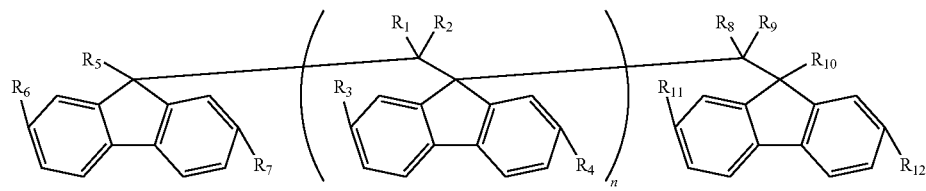

isobutyryl group, methacryloyl group, benzoyl group, naphthoyl group, anthrayl group, and toluoyl group.

As the substituted or unsubstituted ester group, there are included, for example, methyl ester group, ethyl ester group, isopropyl ester group, phenyl ester group, and phenylethyl ester group.

As the substituted or unsubstituted carbamoyl group, there are included, for example, methyl carbamoyl group, ethyl carbamoyl group, isopropyl carbamoyl group, phenyl carbamoyl group, and phenylethyl carbamoyl group.

Examples of the substituent which $R_1$, $R_2$, $R_3$, $R_4$, $R_5$, $R_6$, $R_7$, $R_8$, $R_9$, $R_{10}$, $R_{11}$, and $R_{12}$ may have include, but not limited to, an alkyl group, an aralkyl group, a cycloalkyl group, an alkenyl group, a cycloalkenyl group, an alkoxyl group, an aryl group, a heterocyclic group, an amino group, a carbonyl group, an ester group, and a carbamoyl group as described above, and further a halogen group, a nitro group, and a cyano group.

Examples of the oligofluorene compound represented by the general formula [1] are shown below. However, the present invention is of course not limited thereto.

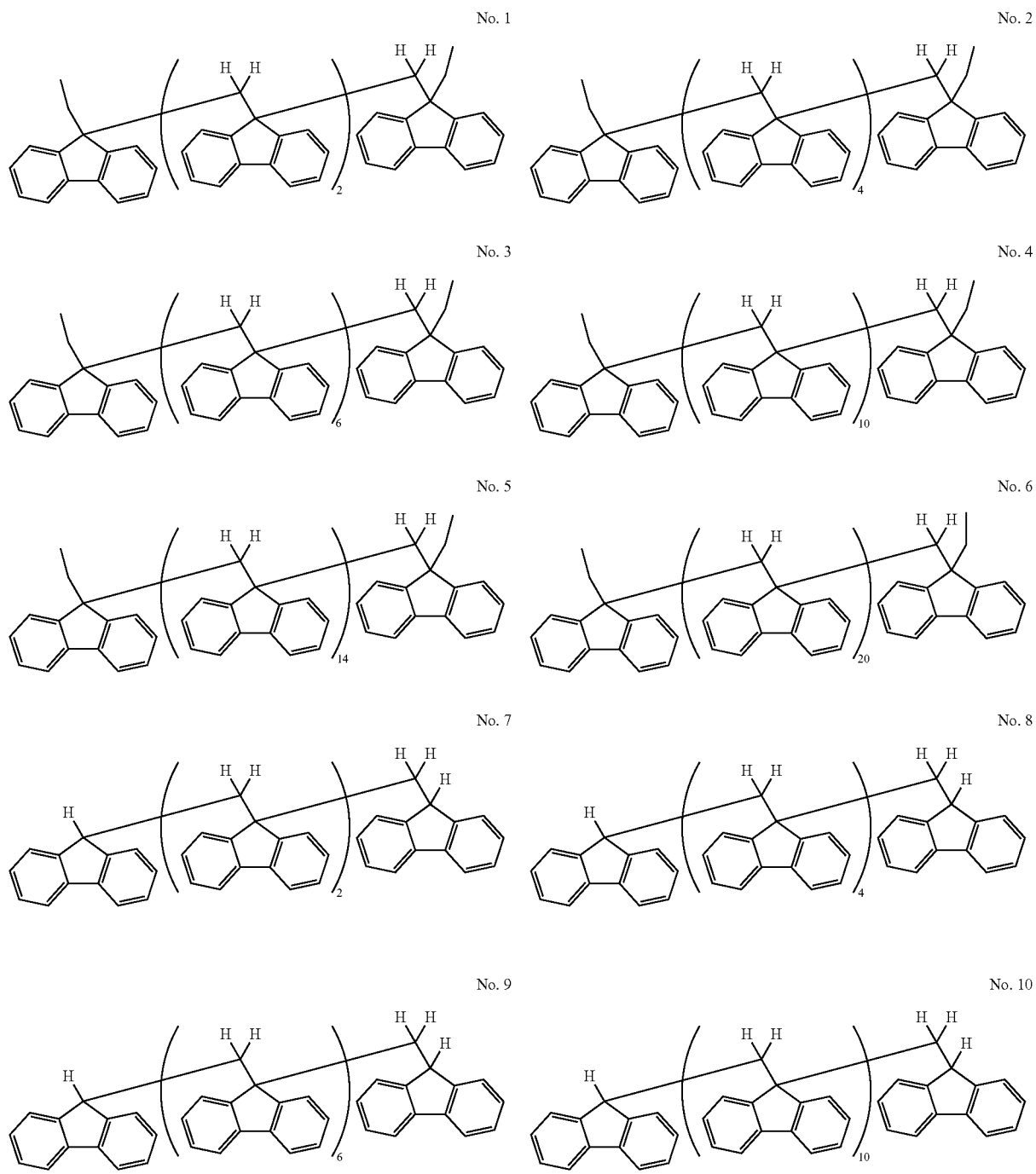

-continued
No. 11
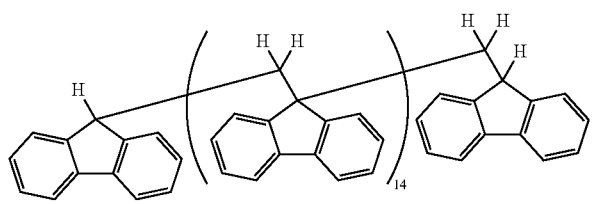
No. 12
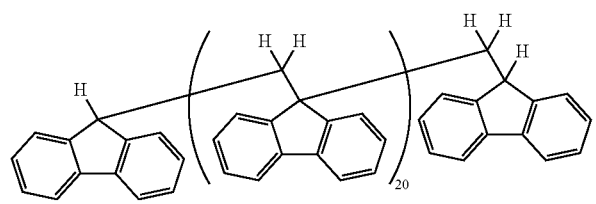
No. 13
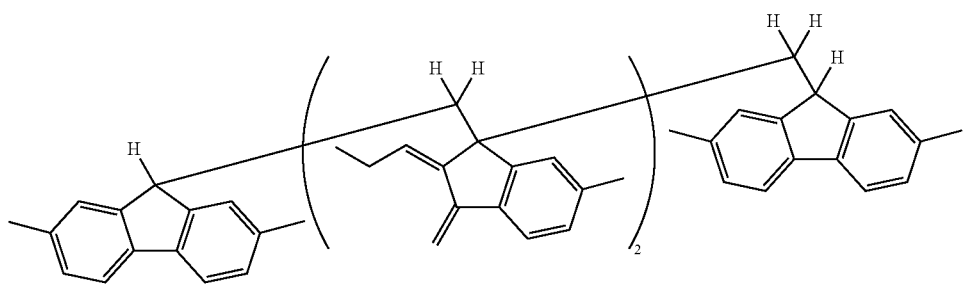
No. 14
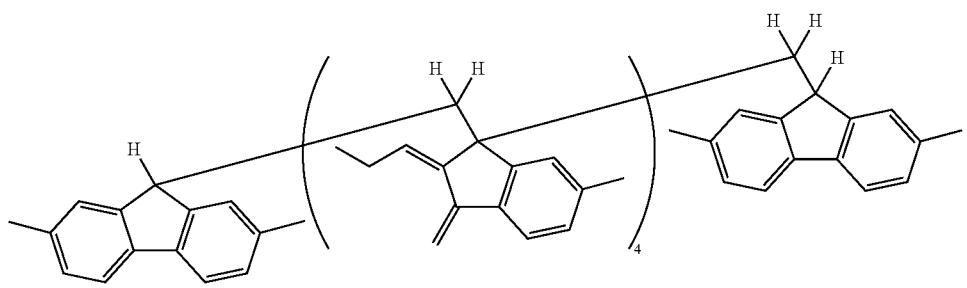
No. 15
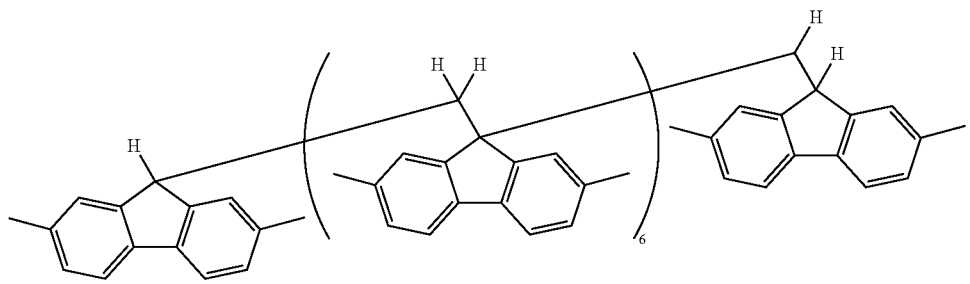
No. 16
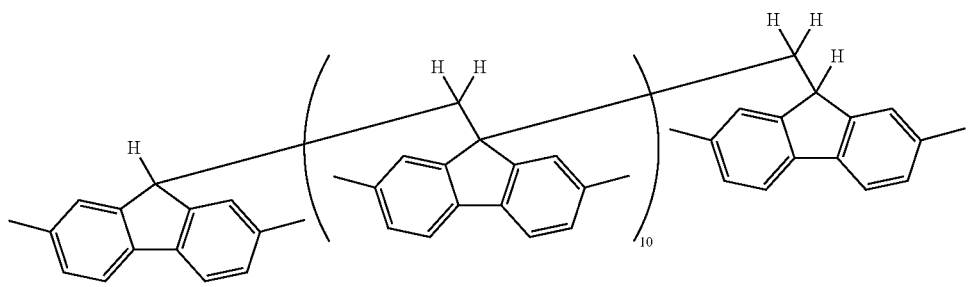

-continued
No. 17
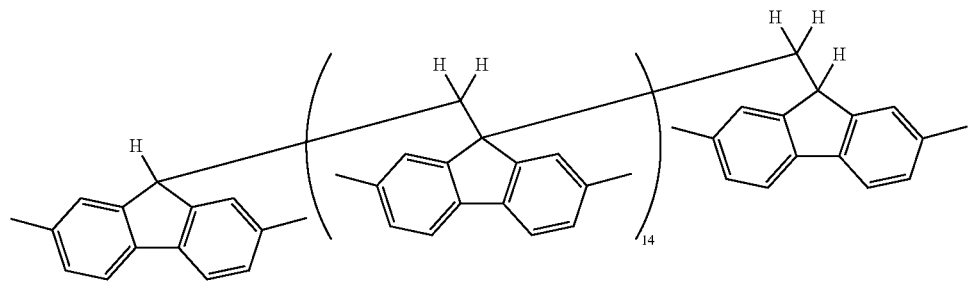
No. 18
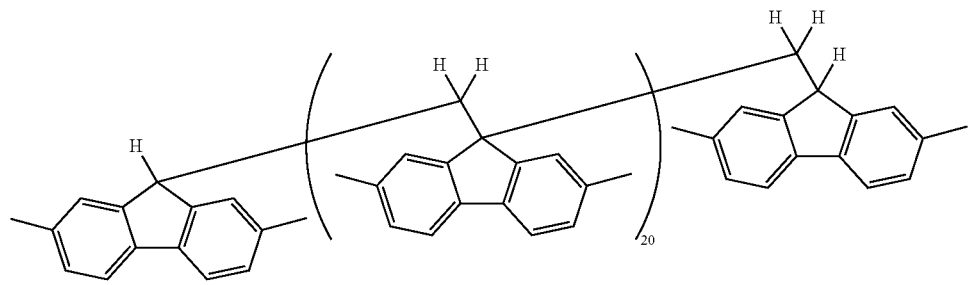
No. 19
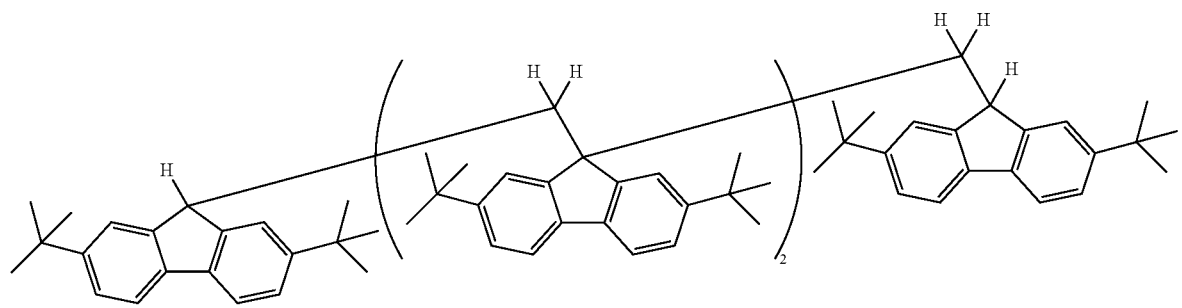
No. 20
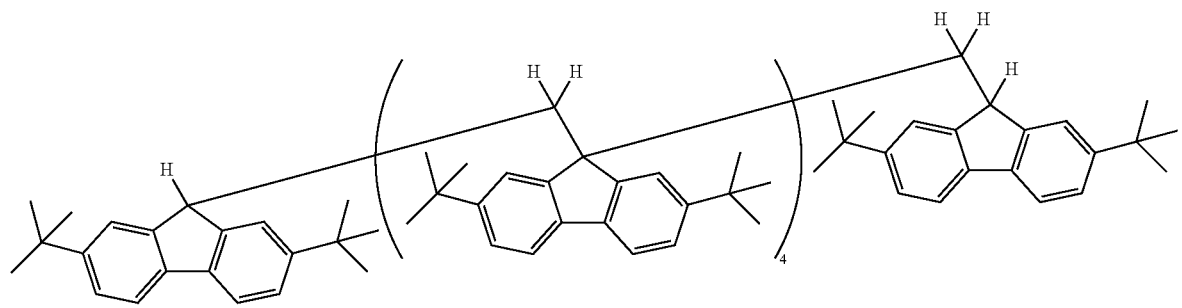
No. 21
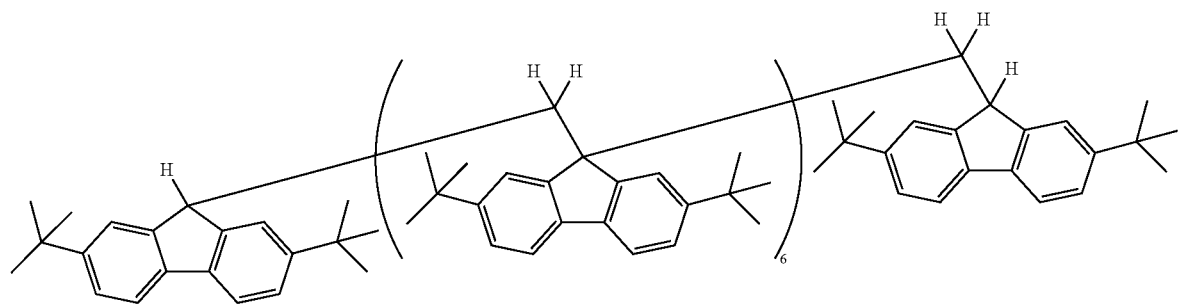

-continued
No. 22
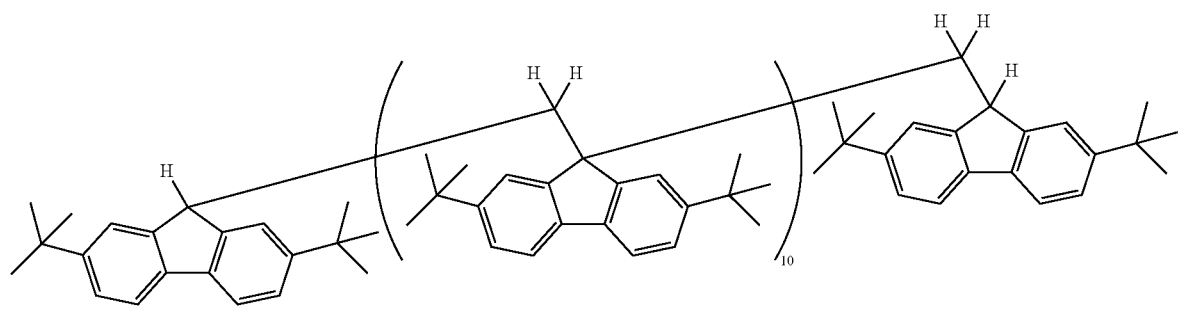
No. 23
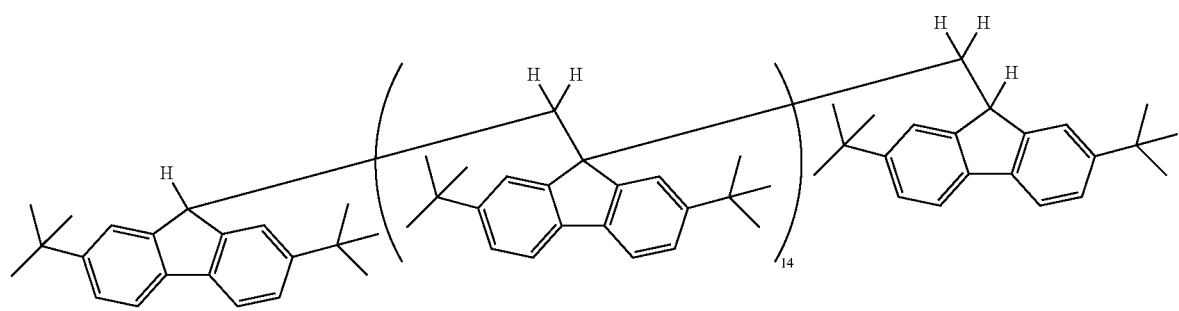
No. 24
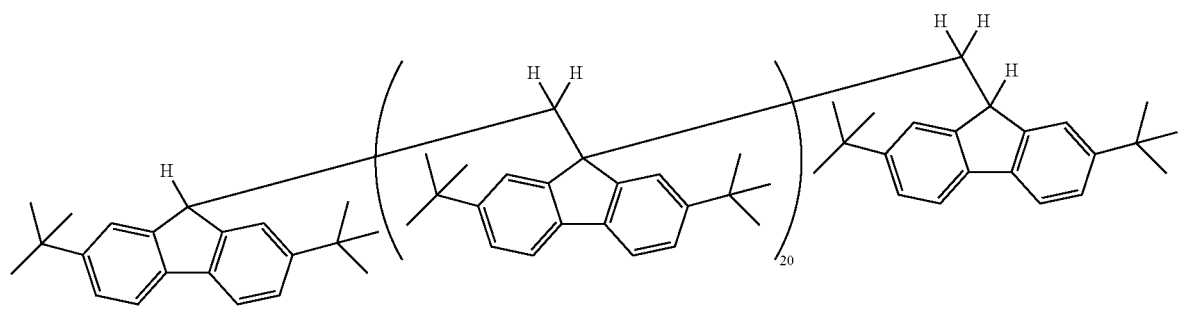
No. 25
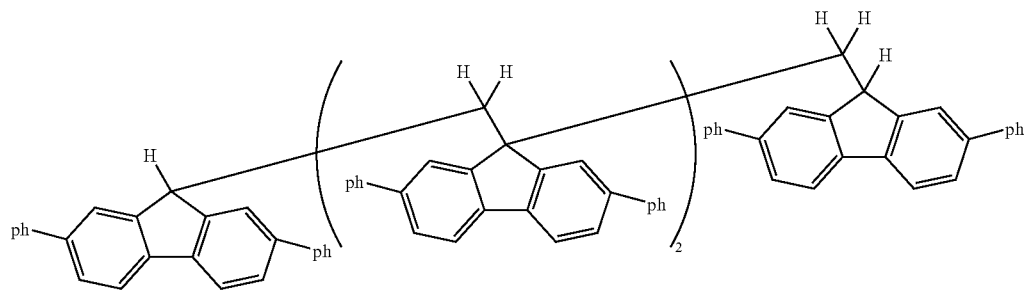
No. 26
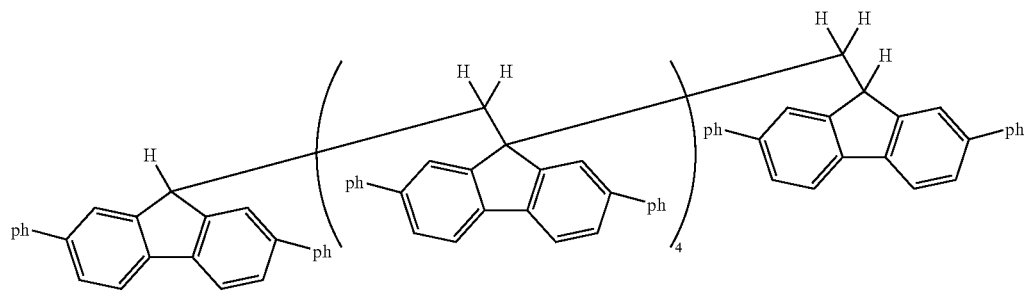

-continued
No. 27
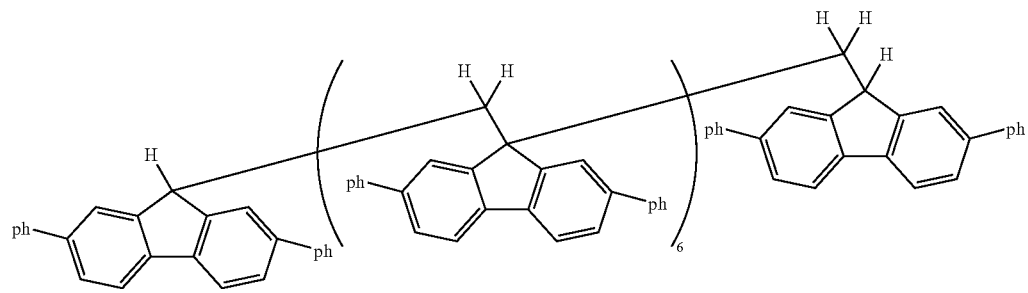
No. 28
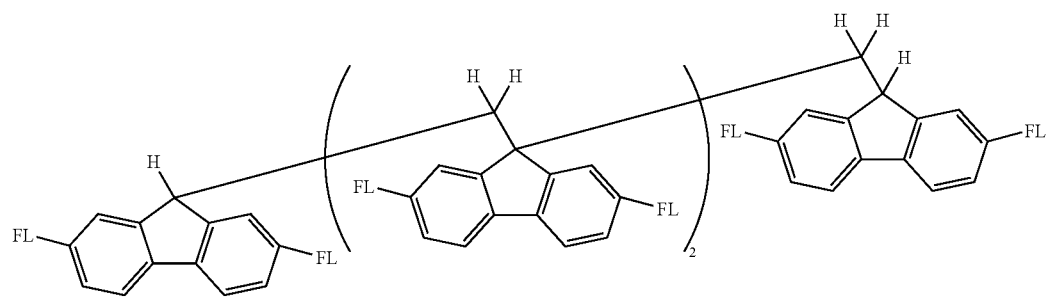
No. 29
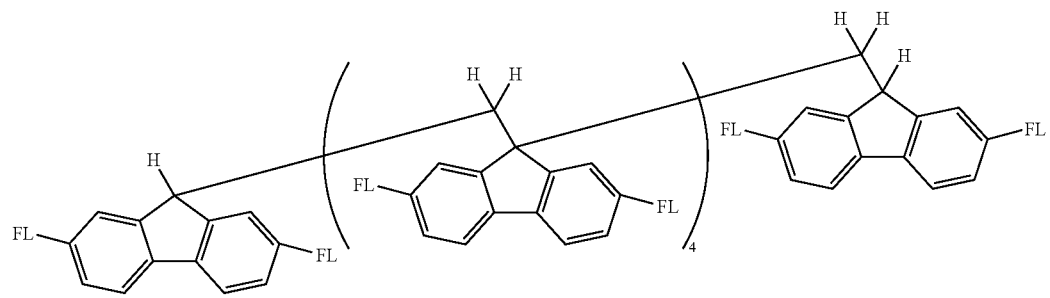
No. 30
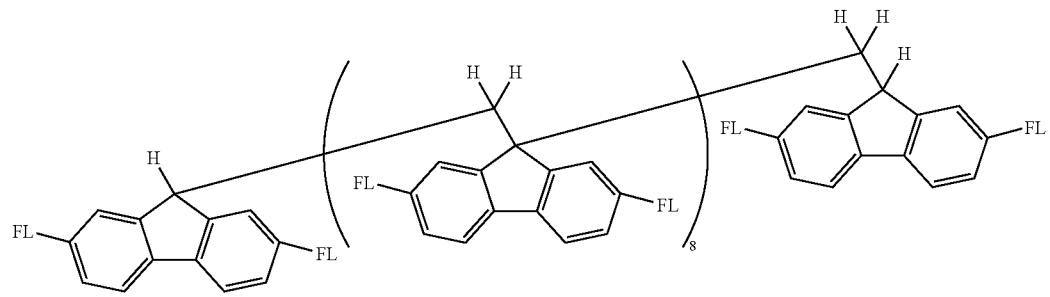
No. 31
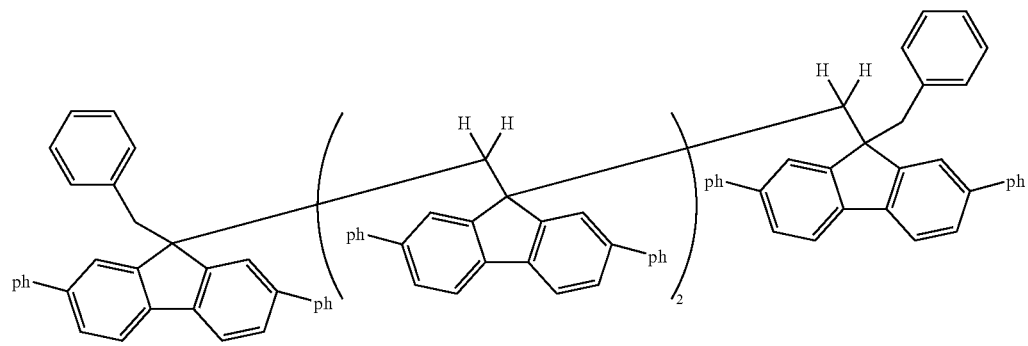

-continued
No. 32
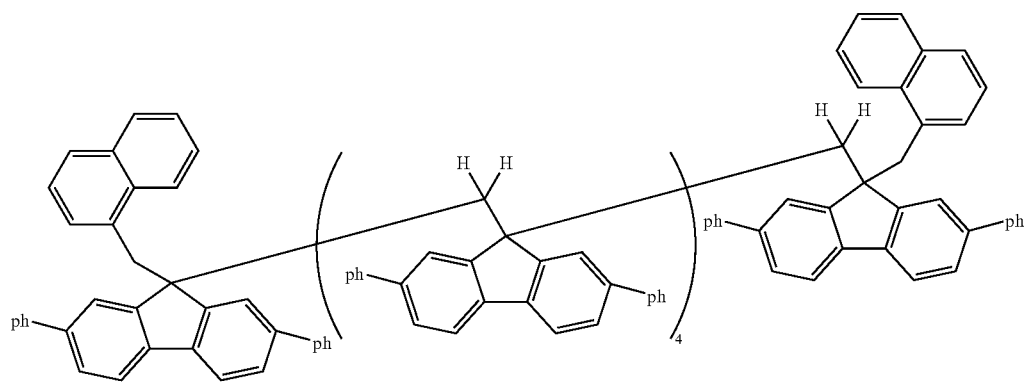
No. 33
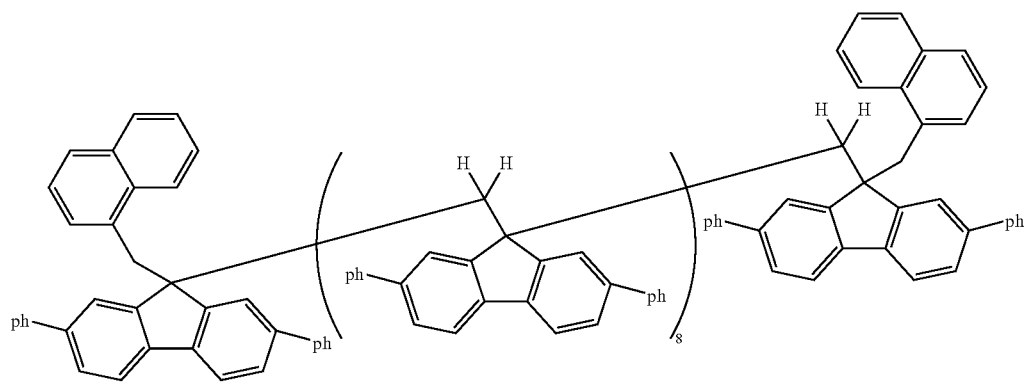
No. 34    No. 35
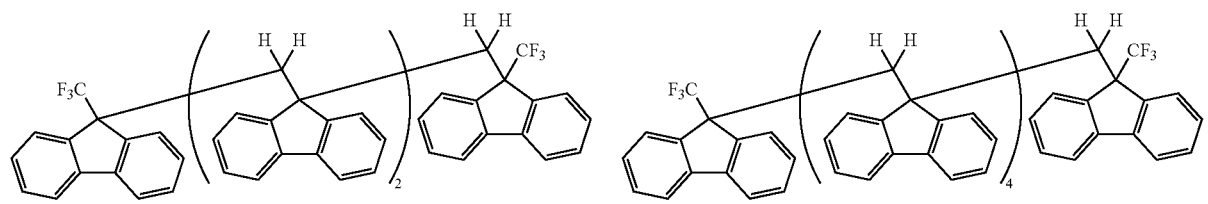
No. 36    No. 37
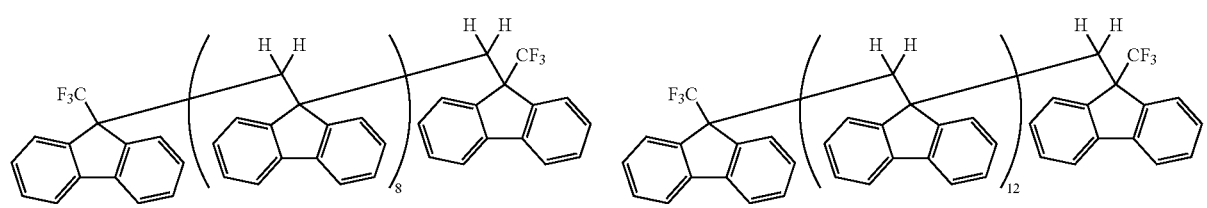
No. 38    No. 39
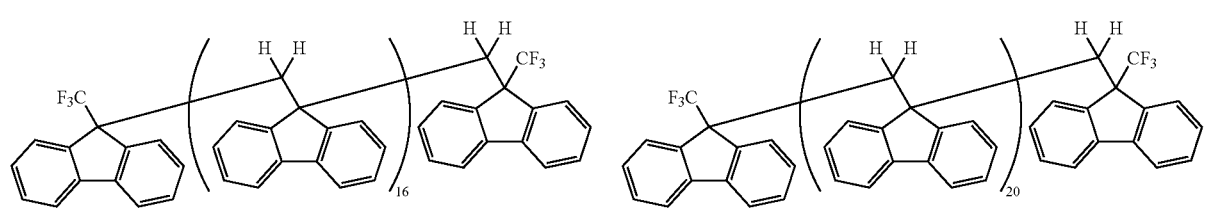

-continued

No. 40
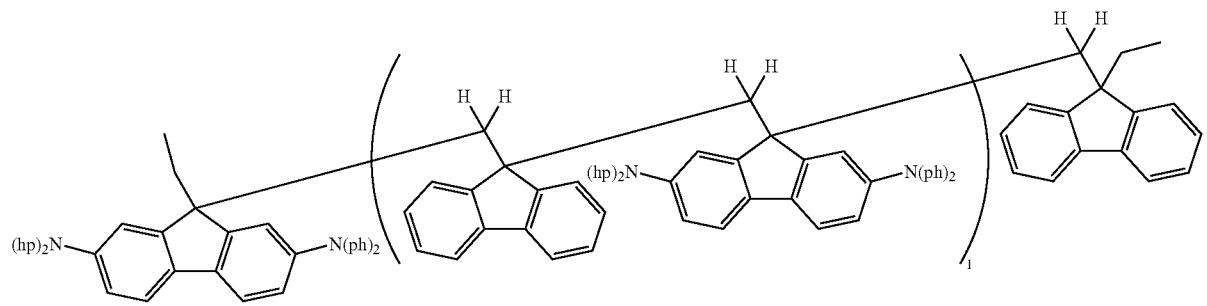

No. 41
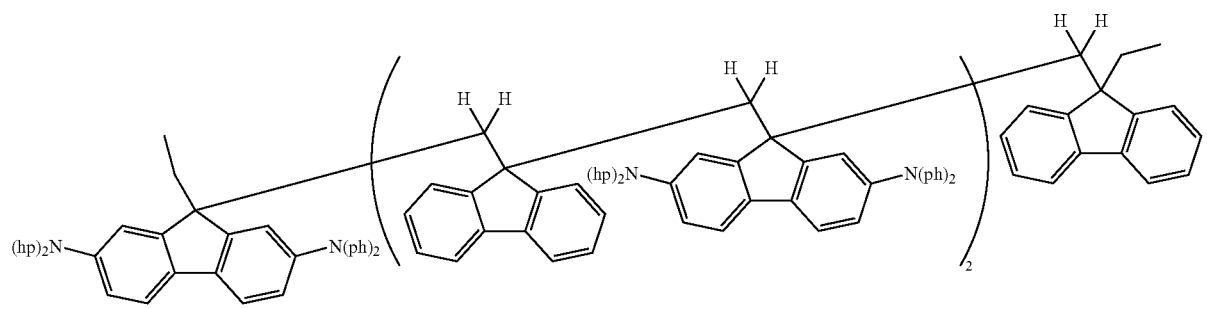

No. 42
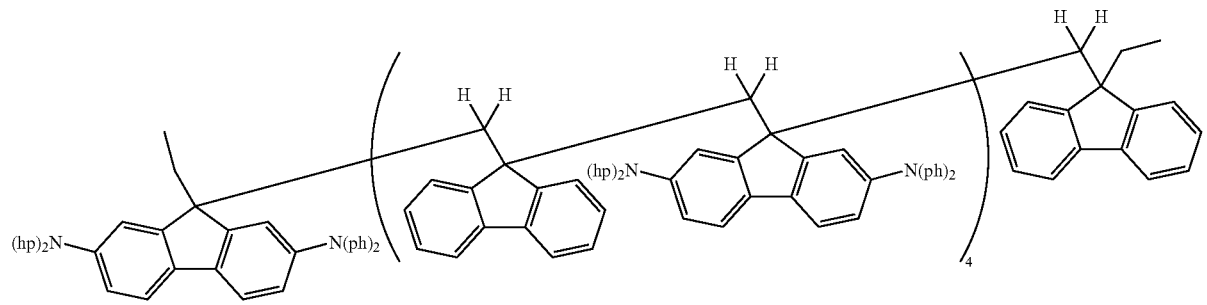

Incidentally, in the above formulae, ph and hp each represent a phenyl group, and EL represents a fluorene group.

The repetition number n of the fluorene units in the general formula [1] is an integer of 1 to 20, and the emission wavelength can be adjusted by selecting the unit number. The molecular weight of the oligofluorene compound of the present invention is not particularly limited but the absolute molecular weight is preferably 300 or more and 10,000 or less because the film stability improves with increasing molecular weight.

When the oligofluorene compound represented by the general formula [1] do not have sufficient solubility to a solvent, the oligofluorene compound may have a substituent for improving the solubility, such as an alkyl group or a trifluoromethyl group.

Because the compound can be subjected to vacuum deposition as long as it has sublimation property, the number n of the repeating units is not limited depending on whether the device production process is a vacuum deposition process or a coating process.

Examples of the coating process for producing the organic light-emitting device include, but not limited to, a spin coating method, an inkjet method, a printing method (such as offset printing, gravure printing, relief printing, intaglio printing, or screen printing), a spray method, and a liquid development method utilizing electrophotography.

Although the method of synthesizing the oligofluorene compound represented by the general formula [1] is not particularly limited, for example, the following two documents each describe a method of synthesizing the oligofluorene compound:
(1) Takimiya et al. (K. Takimiya, K. Kato, Y. Aso, F. Ogura, and T. Otsubo, Bull. Chem. Soc. Jpn., 75, 1795-1805 (2002)); and
(2) Erik et al. (Erik Wiklund and Rolf Ha kansson, Chemica Scripta., 3, 220-225 (1973)).

In addition, for example, the following three documents each describe a method of synthesizing a series of substituted products and oligomers of the oligofluorene:
(1) Suzuki coupling method involving the use of a palladium catalyst (such as Chem. Rev. 1995, 95, 2457-2483);
(2) Yamamoto method involving the use of a nickel catalyst (such as Bull. Chem. Soc. Jpn. 51, 2091, 1978); and
(3) Method of synthesizing an oligomer body by using an aryltin compound (such as J. Org. Chem., 52, 4296, 1987).

The oligofluorene compound represented by the general formula [1] may be used as a material to be incorporated into a light-emitting layer. In a light-emitting layer containing the oligofluorene compound and at least one kind of other light-emitting materials, or a hole-transporting material or an electron-transporting material, the concentration of the oligofluorene compound has a largely influence, in particular, on emission spectrum, emission efficiency, carrier balance, and the like.

The weight ratio (B/A) of the light-emitting compound (B) selected from a fluorescent compound or a phosphorescent compound to the oligofluorene compound (A) is preferably 1/100 or more and 100/100 or less, more preferably 1/100 or more and 30/100 or less. A weight ratio of the light-emitting compound selected from a fluorescent and a phosphorescent compound to the oligofluorene compound of less than 1/100 cannot provide sufficient light emission from a light-emitting material. On the other hand, a weight ratio in excess of 100/100 causes the concentration quenching of the light-emitting material, with the result that emission efficiency is reduced.

In addition, the oligofluorene compound may be used as a material to be incorporated into a hole-transporting or electron-transporting layer. The weight ratio (A/C) of the oligofluorene compound (A) to a hole-transporting or electron-transporting material (C) is preferably 1/100 or more and 100/100 or less, more preferably 10/100 or more and 50/100 or less depending on required light emission characteristics.

The oligofluorene compound used in the present invention shows excimer emission or exciplex emission.

The term "excimer emission" herein employed refers to the emission of light from an excimer formed of a molecule in an excited state produced by photoexcitation of a molecule in a ground state and a molecule in a ground state of the same kind of compound existing in the vicinity thereof.

The term "exciplex emission" herein employed refers to the emission of light from an exciplex formed of a molecule in an excited state produced by photoexcitation of a molecule in a ground state and a molecule in a ground state of a different kind of compound existing in the vicinity thereof.

Hereinafter, an excimer state will be described.

Excimer emission is observed in, for example, a general solution of the oligofluorene compound represented by the general formula [1] in chloroform, toluene, or the like, or a vacuum deposited film, a spin-coated film, or any other coated film of the compound.

The state in which excimer emission is observed means that an excimer state is formed, which specifically means that the same kind of chromophores facing each other in a molecule each have such skeleton as shown in the oligofluorene compound of the general formula [1] to undergo Π-stacking, whereby a strong interaction in the p-orbital direction is present between the Π orbitals of the chromophores of the respective units.

Considering the charge transfer of a hopping mechanism, the oligofluorene compound of the general formula [1] in which Π orbitals overlap each other has a structure which is very ideal for the charge transfer.

Meanwhile, there is a fear that the presence of such an excimer state may serve as a deactivation path for excitation energy as a lower energy level more stabilized than the light emission energy level of a light-emitting molecule to thereby reduce the emission efficiency.

As described in the document J. Am. Chem. Soc., 125, 15474 (2003), even when a large number of such molecules undergo Π-stacking, these molecules show excimer emission nearly identical to that observed in a compound in which the first two molecules undergo Π-stacking. That is, it may be assumed that the energy level of an excimer state does not vary largely even when the number of n increases.

Therefore, in the case of a fluorescent device, the oligofluorene compound can be used as a host material for a fluorescent compound when the excimer emission of the compound has a maximal wavelength within the range of 350 nm or more and 600 nm or less. Specifically, it is preferable that the oligofluorene compound has a maximal emission at a wavelength within the range of 350 nm or more and 470 nm or less when used as a host material for a blue fluorescent material. Further, it is preferable that the oligofluorene compound has a maximal emission at a wavelength shorter than 500 nm and at a wavelength shorter than 600 nm, respectively, when used as a host material for a green fluorescent material and a red fluorescent material.

When the oligofluorene compound is used as a host material in a phosphorescent device, the triplet energy level of the oligofluorene compound becomes an issue. A research report has been made on the triplet excimer of a fluorene dimer (J. Phys. Chem. A 2005, 109, 6799-6804). According to the document, the oligofluorene compound represented by the general formula [1] is expected to form a triplet excimer state.

There is no clear teaching in the art as to the energy level of a triplet excimer state because the state is often a non-light/emission state. Accordingly, it is assumed that the stabilization energy due to the formation of a triplet excimer state of the oligofluorene compound represented by the general formula [1] is equal to the stabilization energy of a general excimer, that is, 4,000 $cm^{-1}$. At this time, the energy level of the triplet excimer of the oligofluorene compound is estimated to be about 2.5 eV. Accordingly, the compound can be used mainly as a host for a red- to green-light-emitting material in a phosphorescent device.

A host material for a blue phosphorescent material requires a T1 energy level of about 2.7 eV or more. The T1 energy of fluorene as a monomer is 2.93 eV (see, for example, Section 3 of "Handbook of Photochemistry" by S. L. Murov et al.). As described above, the energy level of a triplet excimer depends on the degree of the Π-stacking thereof. Therefore, the oligofluorene compound can function also as a host for a blue phosphorescent material by controlling the conformation of the ethylene skeleton as a main chain of the compound.

Although the above description has been made by taking, as an example, an excimer in a singlet state or a triplet state, the same applies to an exciplex in Π-stacked molecules such as the oligofluorene compound represented by the general formula [1]. That is, it may be assumed that an excimer and an exciplex are substantially identical to each other in fluctuation in energy level involved in a Π-stacking state.

The degree of Π-stacking can be changed by, for example, introducing a group having steric hindrance into the ethylene chain as a main chain or introducing a substituent into a terminal of the ethylene chain. Such introduction suppresses a change in the conformation, thereby promoting or suppressing excimer formation. Accordingly, various substituents may be introduced into a fluorene moiety to adjust the Π-stacking.

The oligofluorene compound represented by the general formula [1] may be used as a material to be incorporated into a hole-transporting layer. For example, in a hole-transporting layer formed of the oligofluorene compound and at least one kind of other hole-transporting materials, the concentration of the oligofluorene compound has a large influence on a hole-transporting ability, a hole injection property, and a carrier balance. The weight ratio of the oligofluorene compound to the hole-transporting compound is preferably 1/100 or more and 100/100 or less, because a weight ratio of less than 1/100 cannot provide a sufficient effect of improving the hole-transporting property while a weight ratio of more than 100/100 lowers the property of injecting holes into the hole-transporting layer.

The oligofluorene compound of the general formula [1] may be used as a material to be incorporated into an electron-transporting layer. For example, in an electron-transporting layer formed of the oligofluorene compound and at least one kind of other electron-transporting materials, the concentration of the oligofluorene compound has a largely influence on an electron-transporting property, an electron injection property, and a carrier balance/The weight ratio of the oligofluorene compound to the electron-transporting compound is preferably 1/100 or more and 100/100 or less because a weight ratio of less than 1/100 cannot provide a sufficient effect of improving the electron-transporting property while a weight ratio of more than 100/100 lowers the property of injecting electrons into the electron-transporting layer.

As shown in Exemplified Compounds Nos. 40, 41, and 42, the oligofluorene compound of the general formula [1] of the present invention may be a compound having such a structure that a fluorene and a fluorene unit having an electron-donative substituent such as an amino group are alternately repeated. In this case, because the compound has appropriate hole-transporting property in one molecule, and an increase in HOMO level is caused by the electron-donative property of the amino group, the device characteristics can be controlled.

FIGS. 1 to 6 are cross-sectional views illustrating preferable examples of the organic light-emitting device according to the present invention.

Here, the reference numerals in the figures will be explained.

Reference numeral 1 denotes a substrate, reference numeral 2 denotes an anode, reference numeral 3 denotes a light-emitting layer, reference numeral 4 denotes a cathode, reference numeral 5 denotes a hole-transporting layer, reference numeral 6 denotes an electron-transporting layer, reference numeral 7 denotes a hole injection layer, reference numeral 8 denotes a hole/exciton blocking layer, and reference numeral 9 denotes an electron injection layer.

FIG. 1 is a cross-sectional view showing an example of the organic light-emitting device according to the present invention. In FIG. 1, the device has a configuration in which an anode 2, a light-emitting layer 3, and a cathode 14 are provided sequentially on a substrate 1. A light-emitting device with this configuration is advantageous when the light-emitting material itself has all of hole transportability, electron transportability, and light-emitting property, or when compounds, respectively, having these characteristics are used in combination.

Figure 2:
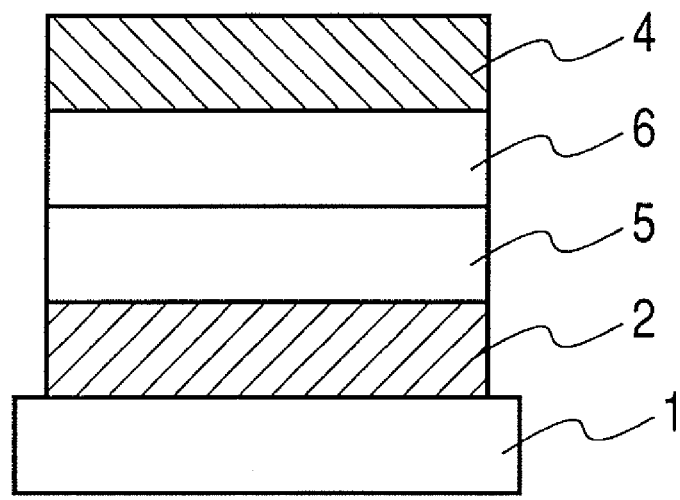
FIG. 2 is a cross-sectional view illustrating another example of the organic light-emitting device of the present invention.

FIG. 2 is a cross-sectional view showing another example of the organic light-emitting device according to the present invention. In FIG. 2, the device has a configuration such that an anode 2, a hole-transporting layer 5, an electron-transporting layer 6, and a cathode 4 are formed sequentially on a substrate 1. A light-emitting device with this configuration is advantageous when a light-emitting material having either or both of hole transportability and electron transportability is used for the respective layers, in combination with a hole-transporting material having no light-emitting property or an electron-transporting material having no light-emitting property. In addition, in this case, either one of the hole-transporting layer 5 and the electron-transporting layer 6 also serves as the light-emitting layer.

Figure 3:
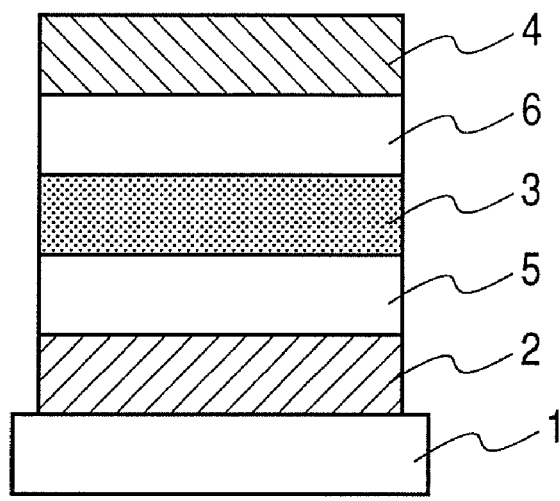
FIG. 3 is a cross-sectional view illustrating still another example of the organic light-emitting device of the present invention.

FIG. 3 is a cross-sectional view showing still another example of the organic light-emitting device according to the present invention. In FIG. 3, the device has a configuration in which an anode 2, a hole-transporting layer 5, a light-emitting layer 3, an electron-transporting layer 6, and a cathode 4 are formed sequentially on a substrate 1. With this configuration, the carrier-transporting function and the light-emitting function are separated from each other, and compounds, respectively, having hole-transporting property, electron-transporting property, and light-emitting property can be used appropriately in combination, so that the degree of freedom in selecting materials greatly increases. Further, since various kinds of compounds having different emission wavelengths can be used, a variety of emission wavelengths can be achieved. Moreover, carriers or excitons can be effectively confined in the light-emitting layer at the middle portion, to thereby increase the emission efficiency.

Figure 4:
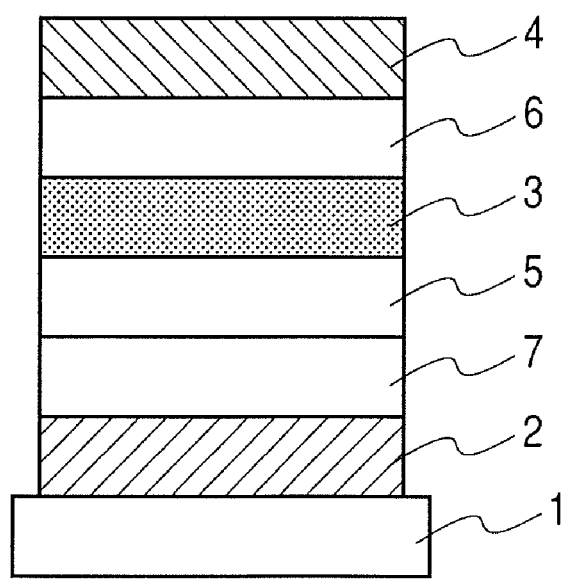
FIG. 4 is a cross-sectional view illustrating yet another example of the organic light-emitting device of the present invention.

FIG. 4 is a cross-sectional view showing yet another example of the organic light-emitting device according to the present invention. In FIG. 4, as compared with FIG. 3, the device is constructed such that a hole injection layer 7 is provided on the anode side, which is effective for improving adhesion between the anode 2 and the hole-transporting layer 5 or improving the hole injection property, thus being effective for reducing the driving voltage.

Figure 5:
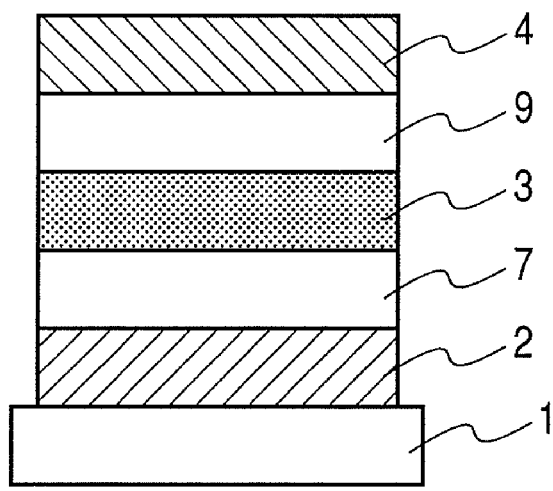
FIG. 5 is a cross-sectional view illustrating still a further example of the organic light-emitting device of the present invention.

FIG. 5 is a cross-sectional view showing still a further example of the organic light-emitting device according to the present invention. In FIG. 5, instead of the respective transporting layers in FIG. 3, the device is constructed such that a hole injection layer 7 is provided on the anode 2 side, and an electron injection layer 9 is provided on the cathode 4 side, which is effective for improving, respectively, the hole injection property and the electron injection property, thus being effective for reducing the driving voltage.

Figure 6:
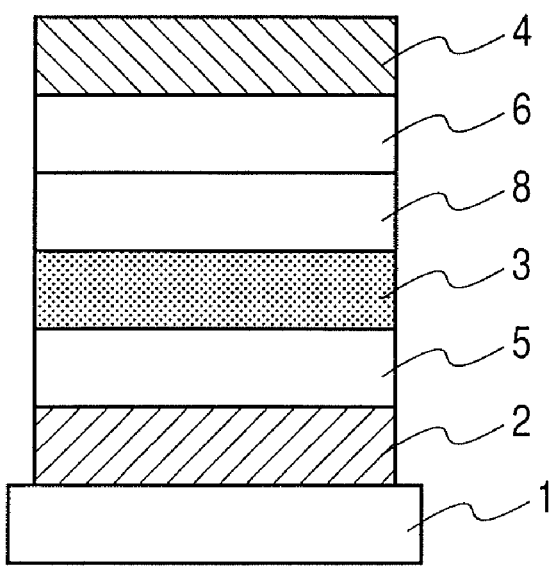
FIG. 6 is a cross-sectional view illustrating yet still another example of the organic light-emitting device of the present invention.

FIG. 6 is a cross-sectional view showing yet still another example of the organic light-emitting device according to the present invention. In FIG. 6, as compared with FIG. 3, the device is constructed such that a layer (a hole blocking layer 8) serving to prevent holes or excitons from passing through toward the cathode 4 is provided between the light-emitting layer 3 and the electron-transporting layer 6. Using a compound having an extremely high ionization potential for the hole blocking layer 8 is effective for improving the emission efficiency.

It is to be noted that FIGS. 1 to 6 merely show very basic device configurations, and that the structure of the organic light-emitting device using the compound according to the present invention is not limited thereto. For example, it is possible to adopt various layer configurations, such as one in which an insulating layer is provided at an interface between an electrode and an organic layer, one in which an adhesive layer or an interference layer is provided, or one in which a hole-transporting layer is composed of two layers with different ionization potentials.

The present invention relates to the light-emitting layers or light-emitting regions of the above mentioned various configurations and can be carried out in any one of the configurations described above. As other constituent components, there can be used a hitherto known hole-transporting compound, electron-transporting compound, or the like as needed.

An anode material used preferably has as large a work function as possible, and includes, for instance, an elemental metal such as gold, platinum, nickel, palladium, cobalt, selenium, and vanadium, an alloy thereof, and a metal oxide such as stannic oxide, zinc oxide, indium tin oxide (ITO) and indium zinc oxide. Further, a conductive polymer such as polyaniline, polypyrrole, polythiophene, and polyphenylene sulfide can be employed. These electrode materials can be used singly or in combination.

On the other hand, a cathode material used preferably has a low work function, and includes, for instance an elemental metal such as lithium, sodium, potassium, calcium, magnesium, aluminum, indium, silver, lead, tin, and chromium, or an alloy made of a plurality of the above metals. A metal oxide such as indium tin oxide (ITO) can be also used. In addition, the cathode may be either of a single layer configuration or of a multilayer configuration.

A substrate used in the present invention is not particularly limited, but an opaque substrate such as a metal substrate and a ceramic substrate or a transparent substrate such as glass, quartz, and a plastic sheet is used. Further, it is also possible to employ, for a substrate, a color filter film, a fluorescent color conversion filter film and a dielectric reflective film to thereby control the emission color.

Incidentally, after a device has been produced, a protective layer or an encapsulation layer may further be provided, for the purpose of preventing contact with oxygen or moisture. Examples of such a protective layer include a diamond thin film; a film of an inorganic material such as a metal oxide and a metal nitride; a film of a polymer such as a fluororesin, poly-p-xylene, polyethylene, silicone resin, and polystyrene resin; and further a film of a photocurable resin. Further, the produced device may also be covered with glass, a gas-impermeable film and a metal, or be packaged with a suitable encapsulation resin.

The highly efficient light-emitting device of the present invention can be applied to a product requiring energy savings or high luminance. Examples of the applications of the device include a display/illumination apparatus, a light source for a printer, and a backlight for a liquid crystal display apparatus. When applied to the display apparatus, a flat panel display that achieves energy savings, high visibility, and lightening can be provided. Further, when applied to the light source for a printer, a laser light source portion of the laser beam printer now widely used can be replaced with the light-emitting device of the present invention. By disposing in an array the devices that can be independently addressed and by performing desired exposure with respect to a photosensitive drum, an image can be formed. The use of the device of the present invention can significantly reduce the volume of an apparatus. For the application to an illumination apparatus and a backlight, the present invention is expected to offer an energy-saving effect.

EXAMPLES

Hereinafter, the present invention will be described in more detail by way of examples. However, the present invention is not limited thereto.

Synthesis Example 1

(Synthesis of Exemplified Compound No. 1)
Exemplified Compound No. 1 was synthesized by the following reaction.

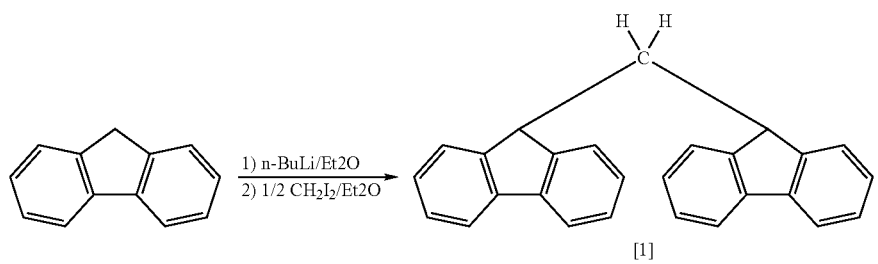

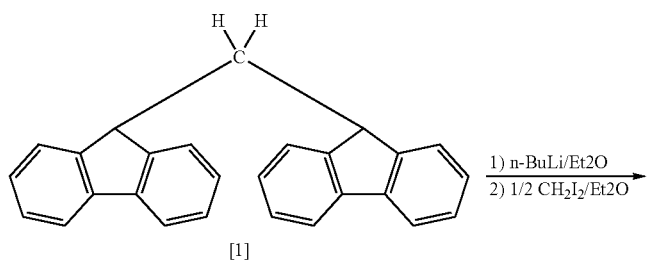

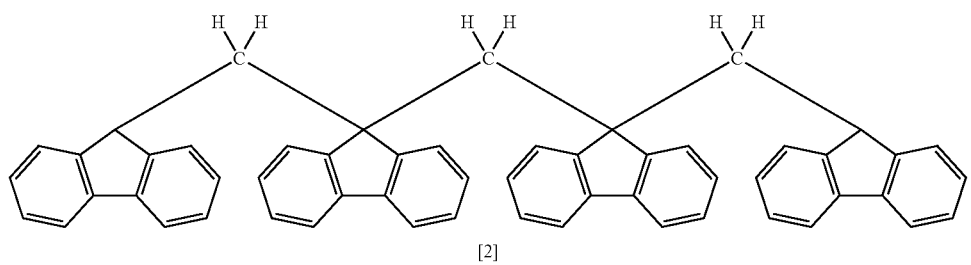

-continued

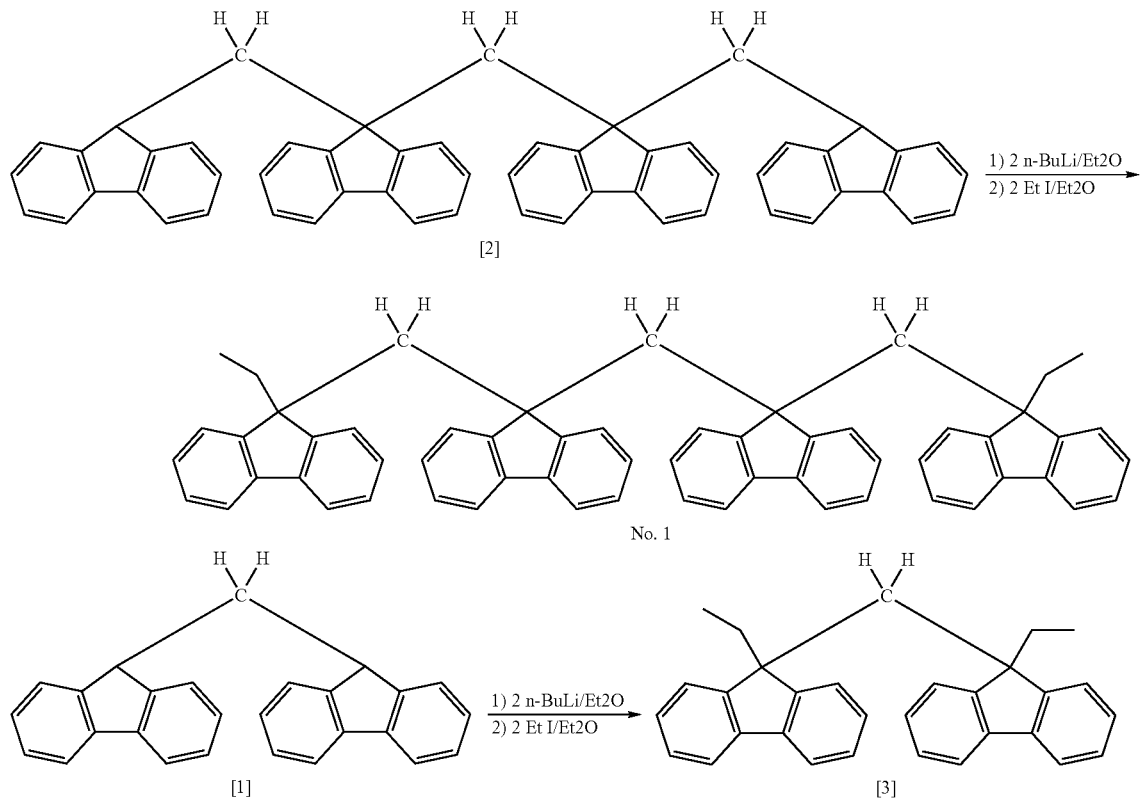

10 g (60.2 mmol) of fluorene and 300 ml of diethyl ether were placed in a 500 ml three-necked flask, and then 40.6 ml (62.8 mmol) of a 15% solution of n-butyllithium in hexane was added dropwise to the mixture in a nitrogen atmosphere at −78° C. After the mixture was gradually heated to room temperature and then stirred for 1 hour, a solution of 2.2 ml (27.3 mmol) of diiodomethane in 10 ml of diethyl ether was added dropwise thereto at −78° C., and the whole was gradually heated to room temperature and then stirred for 8 hours. After the reaction, the organic layer was extracted with chloroform, dried with anhydrous sodium sulfate, and then purified with a silica gel column (hexane/toluene mixed developing solvent) to give 5.6 g of a dimer [1] (white crystal) (60% yield).

2.2 g (6.4 mmol) of a dimer [1] and 150 ml of diethyl ether were placed in a 300 ml three-necked flask, and then 4.3 ml (6.7 mmol) of a 15% solution of n-butyllithium in hexane was added dropwise to the mixture in a nitrogen atmosphere at −78° C. After the mixture was gradually heated to room temperature and then stirred for 1 hour, a solution of 0.78 g (2.9 mmol) of diiodomethane in 5 ml of diethyl ether was added dropwise thereto at −78° C., and the whole was gradually heated to room temperature and then stirred for 8 hours. After the reaction, the organic layer was extracted with chloroform, dried with anhydrous sodium sulfate and purified with a silica gel column (hexane/toluene mixed developing solvent) to give 1.4 g of a tetramer [2] (white crystal) (69% yield).

1.0 g (1.4 mmol) of tetramer [2] and 120 ml of diethyl ether were placed in a 200 ml three-necked flask, and then 2.1 ml (3.3 mmol) of a 15% solution of n-butyllithium in hexane was added dropwise to the mixture in a nitrogen atmosphere at −78° C. After the mixture was gradually heated to room temperature and then stirred for 1 hour, a solution of 0.62 g (4.0 mmol) of iodomethane in 5 ml of diethyl ether was added dropwise thereto at −78° C., and the whole was gradually heated to room temperature and then stirred for 8 hours.

After the reaction, the organic layer was extracted with chloroform, dried with anhydrous sodium sulfate and then purified with a silica gel column (hexane/toluene mixed developing solvent) to give 0.8 g of Exemplified Compound No. 1 (white crystal)(73% yield).

1.0 g (1.4 mmol) of a dimer [1] and 120 ml of diethyl ether were placed in a 200 ml three-necked flask, and then 4.3 ml (6.7 mmol) of a 15% solution of n-butyllithium in hexane was added dropwise to the mixture in a nitrogen atmosphere at −78° C. After the mixture was gradually heated to room temperature and then stirred for 1 hour, a solution of 1.27 g (8.1 mmol) of iodomethane in 5 ml of diethyl ether was added dropwise thereto at −78° C., and the whole was gradually heated to room temperature and then stirred for 8 hours. After the reaction, the organic layer was extracted with chloroform, dried with anhydrous sodium sulfate and then purified with a silica gel column (hexane/toluene mixed developing solvent) to give 0.77 g of [3] (white crystal) (66% yield).

Synthesis Example 2

(Synthesis of Exemplified Compound No. 3)

Exemplified Compound No. 3 was synthesized by the following reaction.

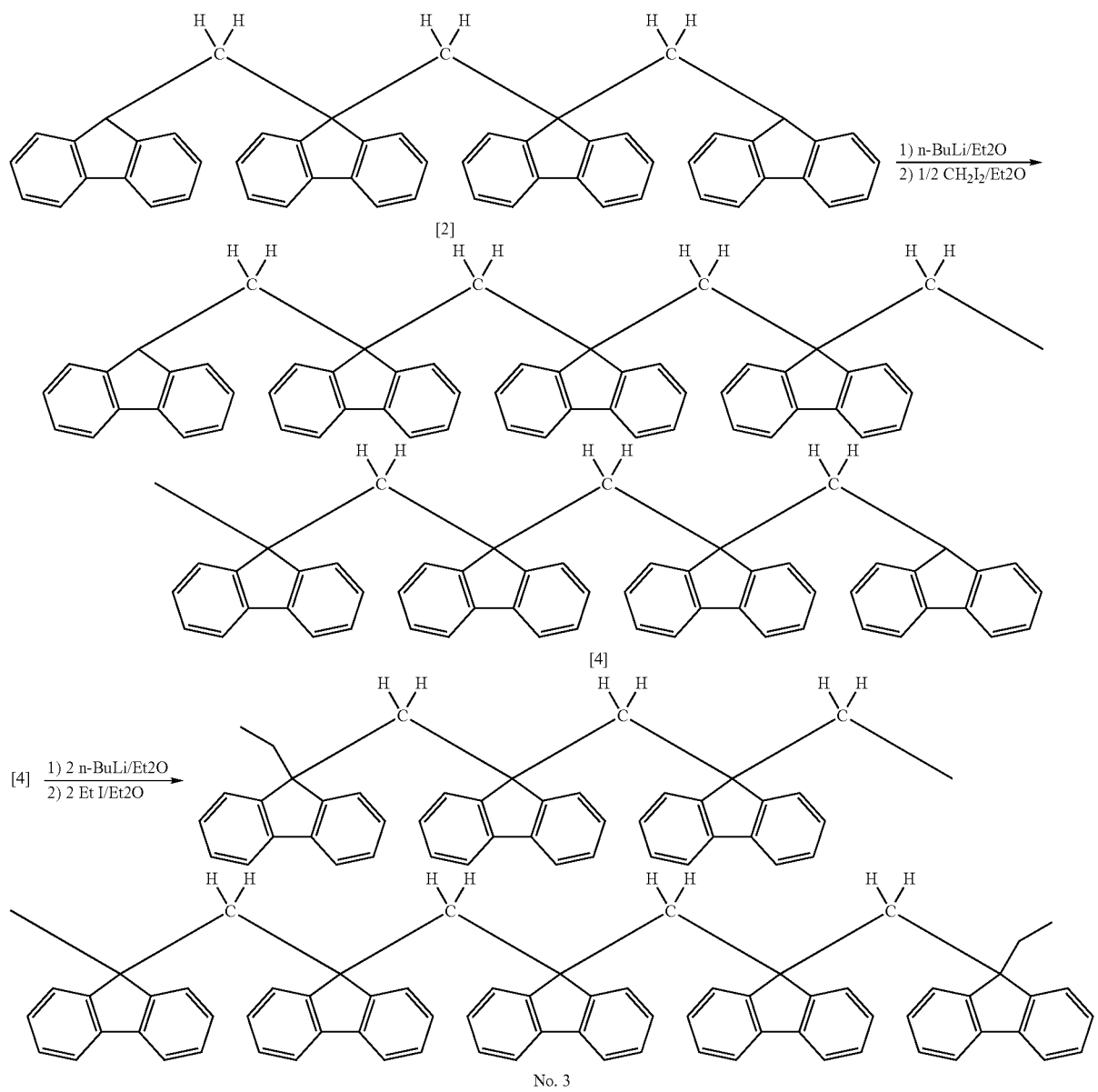

No. 3

1.0 g (1.4 mmol) of the tetramer [2] and 150 ml of diethyl ether were placed in a 200 ml three-necked flask, and then 1.0 ml (1.5 mmol) of a 15% solution of n-butyllithium in hexane was added dropwise thereto in a nitrogen atmosphere at −78° C. After the mixture was gradually heated to room temperature and then stirred for 1 hour, a solution of 0.17 g (0.65 mmol) of iodomethane in 5 ml of diethyl ether was added dropwise thereto at −78° C., and the whole was gradually heated to room temperature and then stirred for 8 hours. After the reaction, the organic layer was extracted with chloroform, dried with anhydrous sodium sulfate, and then purified with a silica gel column (hexane/toluene mixed developing solvent) to give 0.38 g of an octamer [4] (white crystal) (41% yield).

0.3 g (0.21 mmol) of the octamer [8] and 150 ml of diethyl ether were placed in a 200 ml three-necked flask, and then 0.3 ml (0.48 mmol) of a 15% solution of n-butyllithium in hexane was added dropwise thereto in a nitrogen atmosphere at −78° C. After the mixture was gradually heated to room temperature and then stirred for 1 hour, a solution of 0.09 g (0.59 mmol) of iodomethane in 5 ml of diethyl ether was added dropwise thereto at −78° C., and the whole was gradually heated to room temperature and then stirred for 8 hours. After the reaction, the organic layer was extracted with chloroform, dried with anhydrous sodium sulfate, and then purified with a silica gel column (hexane/toluene mixed developing solvent) to give 0.18 g of Exemplified Compound No. 3 (white crystal) (59% yield).

Example 1

Figure 7:
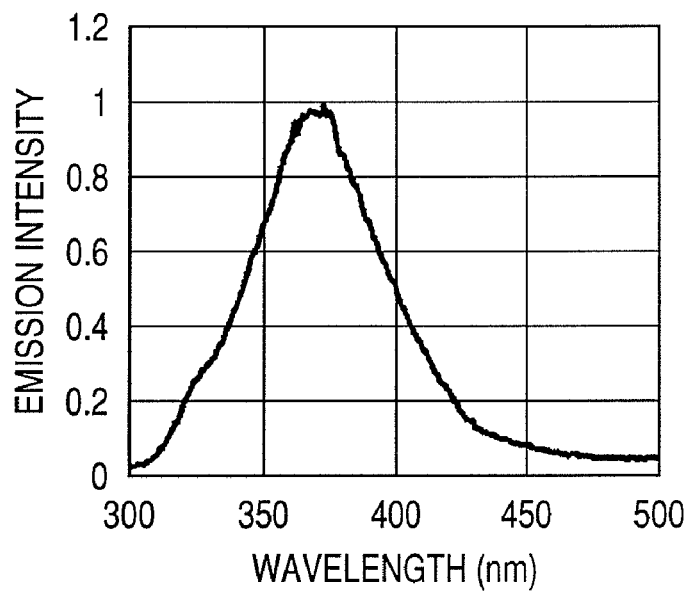
FIG. 7 is a graphical representation illustrating a PL spectrum of Exemplified Compound No. 1 of the present invention.
Figure 8:
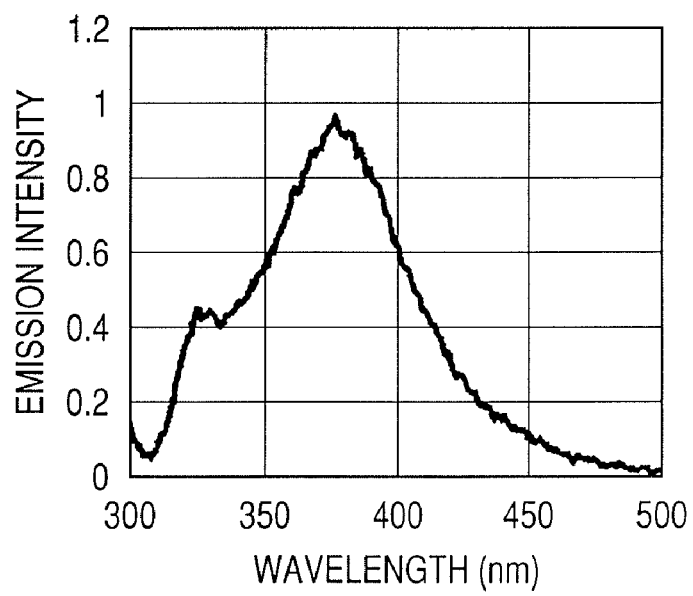
FIG. 8 is a graphical representation illustrating a PL spectrum of Compound [3] of Synthesis Example 1 of the present invention.

FIG. 7 illustrates a PL spectrum of a spin-coated film of Exemplified Compound No. 1. In addition, for comparison, FIG. 8 illustrates a PL spectrum of a spin-coated film of Compound [3] synthesized in Synthesis Example 1. The light emission of the both films having an emission peak at around 375 nm is excimer emission. In contrast, a shoulder observed at a wavelength shorter than the peak wavelength, that is, around 325 nm is a peak derived from the monomer emission. The molecule has a maximal wavelength of a first absorption band at around 303 nm. The Stokes shifts of the monomer fluorescence and the excimer fluorescence are 2,234 cm$^{-1}$ and 6,337 cm$^{-1}$, respectively. It can be seen that an excimer state has a transition energy lower than that of a monomer state by about 4,000 cm$^{-1}$.

Comparison between the ratios of the monomer emission intensity to the excimer emission intensity of Exemplified Compound No. 1 shown in FIG. 7 and that of Compound [3] shows that the ratio of Exemplified Compound No. 1 is smaller than that of Compound [3]. On the other hand, the excimer emission peak shows no large shift. That is, it is seen that the yield in which an excimer state is generated increases with increasing n.

Example 2

A device using Exemplified Compound No. 1 as a host material for a red phosphorescent material was produced and evaluated. A transparent conductive support substrate was prepared which had a film of indium tin oxide (ITO) with a thickness of 120 nm formed on a glass plate by a sputtering method. The transparent conductive support substrate was ultrasonically cleaned sequentially with acetone and isopropyl alcohol (IPA), subsequently washed with boiled IPA, then dried, and further cleaned with UV/ozone.

On the substrate, first, PEDOT/PSS (Baytron P Al 4083 (trade name); manufactured by H. C. Stark) as a hole injection material was formed into a thin film having a thickness of 330 Å by spin coating. Next, as a light-emitting layer, a film having a thickness of 800 Å was formed thereon by spin coating of a xylene solution containing an oligofluorene compound shown as Exemplified Compound No. 1 and a red phosphorescent material represented by the following structural formula (Compound 2) in concentrations of 1.2 wt. % and 0.1 wt. %, respectively, at a rotation number of 1,000 rpm. As an electron injection layer, metal Ca was vacuum deposited thereon to form a film having a thickness of 50 nm. Next, as a cathode, metal Al was vacuum deposited to form a film having a thickness of about 100 nm.

(Compound 2)

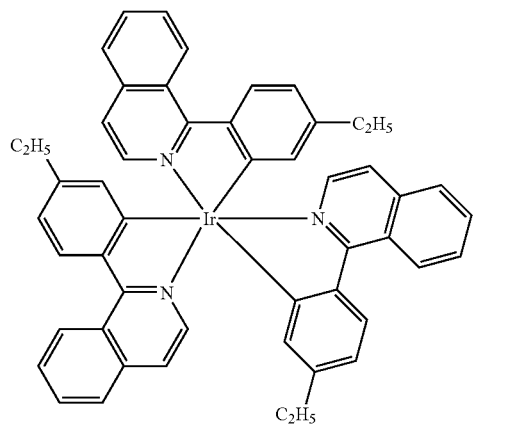

The degree of vacuum at the time of the vacuum deposition was 3×10$^{-6}$ Torr, the film forming rate of Ca was 0.5 nm/sec, and the film forming rate of Al is 2 to 3 Å/sec.

When the thus obtained device was driven at a DC current density of 5 mA/cm$^2$ with the ITO electrode and the Al electrode being used as a positive electrode and a negative electrode, respectively, the device emitted red light with a luminance of about 202 cd/m$^2$.

Examples 3 to 43

Devices were produced by following the same procedure as in Example 2 with the exception that compounds shown in Table 1 were each used instead of Exemplified Compound No. 1, and the devices were evaluated in the same manner as in Example 2 at a DC current density of 5 mA/cm$^2$. Tables 1 and 2 show the results.

TABLE 1

|  | Exemplified Compound No. | Luminance (cd/m$^2$) Dopant: Compound 2 |
|---|---|---|
| Example 2 | 1 | 202 |
| Example 3 | 2 | 190 |
| Example 4 | 3 | 221 |
| Example 5 | 4 | 288 |
| Example 6 | 5 | 230 |
| Example 7 | 6 | 166 |
| Example 8 | 7 | 190 |
| Example 9 | 8 | 187 |
| Example 10 | 9 | 198 |
| Example 11 | 10 | 200 |
| Example 12 | 11 | 202 |
| Example 13 | 12 | 215 |
| Example 14 | 13 | 210 |
| Example 15 | 14 | 205 |
| Example 16 | 15 | 236 |
| Example 17 | 16 | 220 |
| Example 18 | 17 | 230 |
| Example 19 | 18 | 234 |
| Example 20 | 19 | 250 |
| Example 21 | 20 | 240 |
| Example 22 | 21 | 180 |

TABLE 2

|  | Exemplified Compound No. | Luminance (cd/m$^2$) Dopant: Compound 2 |
|---|---|---|
| Example 23 | 22 | 160 |
| Example 24 | 23 | 230 |
| Example 25 | 24 | 220 |
| Example 26 | 25 | 240 |
| Example 27 | 26 | 220 |
| Example 28 | 27 | 180 |
| Example 29 | 28 | 198 |
| Example 30 | 29 | 201 |
| Example 31 | 30 | 202 |
| Example 32 | 31 | 240 |
| Example 33 | 32 | 220 |
| Example 34 | 33 | 230 |
| Example 35 | 34 | 241 |
| Example 36 | 35 | 233 |
| Example 37 | 36 | 215 |
| Example 38 | 37 | 232 |
| Example 39 | 38 | 198 |
| Example 40 | 39 | 187 |
| Example 41 | 40 | 196 |
| Example 42 | 41 | 223 |
| Example 43 | 42 | 240 |

Example 44

A device using Exemplified Compound No. 1 as a host material for a green phosphorescent material was produced and evaluated. A transparent conductive support substrate was prepared which had a film of indium tin oxide (ITO) with a thickness of 120 nm formed on a glass plate by a sputtering method. The transparent conductive support substrate was ultrasonically cleaned sequentially with acetone and isopropyl alcohol (IPA), subsequently washed with boiled IPA, then dried, and further cleaned with UV/ozone.

On the substrate, first, PEDOT/PSS (Baytron P Al 4083 (trade name); manufactured by H. C. Stark) as a hole injection material was formed into a thin film having a thickness of 330 Å by spin coating. Next, as a light-emitting layer, a film having a thickness of 800 Å was formed thereon by spin coating of a xylene solution containing an oligofluorene compound shown as Exemplified Compound No. 1 and a green phosphorescent material represented by the following structural formula (Compound 3) in concentrations of 1.2 wt. % and 0.1 wt. %, respectively, at a rotation number of 1,000 rpm. As an electron injection layer, metal Ca was vacuum deposited thereon to form a film having a thickness of 50 nm. Next, as a cathode, metal Al was vacuum deposited to form a film having a thickness of about 100 nm.

(Compound 3)

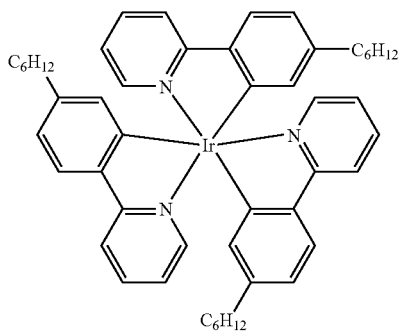

The degree of vacuum at the time of the vacuum deposition was $3 \times 10^{-6}$ Torr, the film forming rate of Ca was 0.5 nm/sec, and the film forming rate of Al is 2 to 3 Å/sec.

When the thus obtained device was driven at a DC current density of 5 mA/cm² with the ITO electrode and the Al electrode being used as a positive electrode and a negative electrode, respectively, the device emitted green light with a luminance of 850 cd/m².

Examples 45 to 85

Devices were produced by following the same procedure as in Example 44 with the exception that the other exemplified compounds except Exemplified Compound No. 1 were each used instead of Exemplified Compound No. 1, and the devices were evaluated in the same manner as in Example 44. Tables 3 and 4 show the results.

TABLE 3

| | Exemplified Compound No. | Luminance (cd/m²) Dopant: Compound 3 |
|---|---|---|
| Example 44 | 1 | 850 |
| Example 45 | 2 | 750 |
| Example 46 | 3 | 802 |
| Example 47 | 4 | 650 |
| Example 48 | 5 | 670 |
| Example 49 | 6 | 752 |
| Example 50 | 7 | 720 |
| Example 51 | 8 | 735 |
| Example 52 | 9 | 700 |
| Example 53 | 10 | 780 |
| Example 54 | 11 | 840 |
| Example 55 | 12 | 750 |
| Example 56 | 13 | 670 |
| Example 57 | 14 | 650 |
| Example 58 | 15 | 630 |
| Example 59 | 16 | 700 |
| Example 60 | 17 | 730 |
| Example 61 | 18 | 715 |
| Example 62 | 19 | 760 |
| Example 63 | 20 | 800 |
| Example 64 | 21 | 605 |

TABLE 4

| | Exemplified Compound No. | Luminance (cd/m²) Dopant: Compound 3 |
|---|---|---|
| Example 65 | 22 | 680 |
| Example 66 | 23 | 630 |
| Example 67 | 24 | 650 |
| Example 68 | 25 | 750 |
| Example 69 | 26 | 730 |
| Example 70 | 27 | 780 |
| Example 71 | 28 | 635 |
| Example 72 | 29 | 850 |
| Example 73 | 30 | 780 |
| Example 74 | 31 | 689 |
| Example 75 | 32 | 700 |
| Example 76 | 33 | 660 |
| Example 77 | 34 | 685 |
| Example 78 | 35 | 701 |
| Example 79 | 36 | 681 |
| Example 80 | 37 | 750 |
| Example 81 | 38 | 720 |
| Example 82 | 39 | 725 |
| Example 83 | 40 | 602 |
| Example 84 | 41 | 800 |
| Example 85 | 42 | 750 |

Comparative Example 1

A device was produced by following the same procedure as in Example 2 with the exception that polyfluorene (Compound 4; manufactured by American Dye Source) was used as a comparative compound instead of Exemplified Compound No. 1, and the device was evaluated in the same manner as in Example 2.

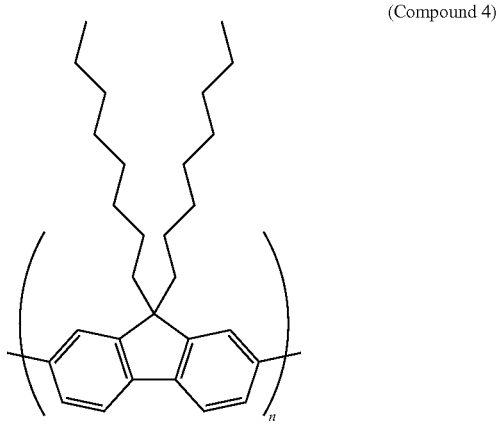

(Compound 4)

The device had a luminance of about 50 cd/m² when driven at a DC current density of 5 mA/cm².

Comparative Example 2

A device was produced by following the same procedure as in Example 44 with the exception that polyvinylcarbazole (molecular weight: 110,000; manufactured by Sigma-Aldrich Corp.) was used as a comparative compound instead of Exemplified Compound No. 1, and the device was evaluated in the same manner as in Example 44.

The device had a luminance of about 500 cd/m² when driven at a DC current density of 5 mA/cm².

The present invention can be utilized in an organic light-emitting device using an oligofluorene compound and having an optical output with high emission efficiency and high luminance. In addition, the organic light-emitting device of the present invention can be utilized as a display device in, for example, a display apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims benefit of Japanese Patent Application No. 2006-166621, filed Jun. 15, 2006, which is hereby incorporated by reference herein in its entirety.

What is claimed is:

1. An organic light-emitting device comprising a pair of electrodes, and at least one layer comprising an organic compound and interposed between the electrodes, wherein the layer comprising the organic compound comprises an oligofluorene compound represented by general formula [1]:

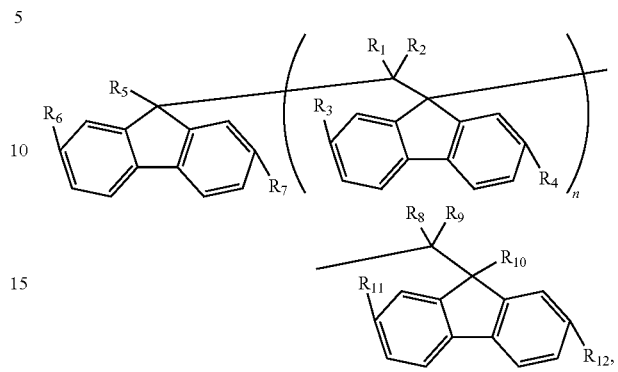

wherein $R_1$, $R_2$, $R_8$, and $R_9$ are each a hydrogen atom; $R_3$, $R_4$, $R_6$, $R_7$, $R_{11}$, and $R_{12}$ each represent, independently of one another, a substituted or unsubstituted alkyl group, a substituted or unsubstituted aryl group, a substituted or unsubstituted fused polycyclic group, or a substituted or unsubstituted amino group; $R_5$ and $R_{10}$ each represent, independently of one another, a hydrogen atom or a substituted or unsubstituted alkyl group; and n represents an integer of 1 to 20.

2. The organic light-emitting device according to claim 1, wherein n in the general formula [1] represents an integer of 1 to 10.

3. The organic light-emitting device according to claim 1, wherein at least a light-emitting layer of the at least one layer comprising the organic compound comprises the oligofluorene compound and a light-emitting compound comprising a fluorescent compound or a phosphorescent compound.

4. The organic light-emitting device according to claim 3, wherein a weight ratio (B/A) of the light-emitting compound (B) to the oligofluorene compound (A) is from 1/100 to 100/100.

5. The organic light-emitting device according to claim 1, wherein at least a hole-transporting layer of the at least one layer comprising the organic compound comprises the oligofluorene compound and a hole-transporting compound.

6. The organic light-emitting device according to claim 5, wherein a weight ratio (A/C) of the oligofluorene compound (A) to the hole-transporting compound (C) is from 1/100 to 100/100.

7. A display apparatus comprising the organic light-emitting device set forth in claim 1.

* * * * *